US012757396B2

(12) United States Patent
Ino et al.

(10) Patent No.: US 12,757,396 B2
(45) Date of Patent: Oct. 6, 2026

(54) METHOD FOR MANUFACTURING OXIDE FILM, METHOD FOR MANUFACTURING SEMICONDUCTOR MEMORY DEVICE, SEMICONDUCTOR DEVICE, AND SEMICONDUCTOR MEMORY DEVICE

(71) Applicant: Kioxia Corporation, Tokyo (JP)

(72) Inventors: Tsunehiro Ino, Fujisawa (JP); Yusuke Nakajima, Yokohama (JP); Akira Takashima, Fuchu (JP)

(73) Assignee: Kioxia Corporation, Tokyo (JP)

( * ) Notice: Subject to any disclaimer, the term of this patent is extended or adjusted under 35 U.S.C. 154(b) by 733 days.

(21) Appl. No.: 17/819,039

(22) Filed: Aug. 11, 2022

(65) Prior Publication Data

US 2023/0301089 A1 Sep. 21, 2023

(30) Foreign Application Priority Data

Mar. 15, 2022 (JP) ................................ 2022-039793

(51) Int. Cl.

*H10B 43/27* (2023.01)
*H10B 41/27* (2023.01)
*H10B 41/35* (2023.01)
*H10B 43/35* (2023.01)

(52) U.S. Cl.

CPC ............ *H10B 43/27* (2023.02); *H10B 41/27* (2023.02); *H10B 41/35* (2023.02); *H10B 43/35* (2023.02)

(58) Field of Classification Search

CPC ........ H10B 43/27; H10B 41/27; H10B 41/35; H10B 43/35

See application file for complete search history.

(56) References Cited

U.S. PATENT DOCUMENTS

| | | | | |
|---|---|---|---|---|
| 6,187,665 B1 * | 2/2001 | Chetlur | H01L 21/28176 | 438/770 |
| 9,780,108 B2 | 10/2017 | Rabkin et al. | | |
| 9,876,025 B2 | 1/2018 | Rabkin et al. | | |
| 10,566,280 B2 | 2/2020 | Wakatsuki et al. | | |
| 2007/0246802 A1 * | 10/2007 | Xianyu | H01L 21/02381 | 438/762 |
| 2007/0259534 A1 * | 11/2007 | Reid | C23C 16/303 | 438/783 |
| 2008/0128833 A1 * | 6/2008 | Kawahara | H01L 21/28185 | 438/785 |
| 2018/0269196 A1 * | 9/2018 | Isogai | H10B 43/40 | |

(Continued)

FOREIGN PATENT DOCUMENTS

| | | |
|---|---|---|
| JP | 2021-44486 A | 3/2021 |
| JP | 2023-44117 A | 3/2023 |

OTHER PUBLICATIONS

Wang et al., "Effect of Water Vapor on Alumina Scale Growth Based on First-Principles Calculations", J. Phys. Chem. C, 125, 2021, 11 pages.

(Continued)

*Primary Examiner* — Suberr L Chi
(74) *Attorney, Agent, or Firm* — Oblon, McClelland, Maier & Neustadt, L.L.P.

(57) ABSTRACT

A method for manufacturing an oxide film according to an embodiment includes forming a first film containing aluminum (Al) and nitrogen (N), and forming a second film containing aluminum (Al) and oxygen (O) by oxidizing the first film in an atmosphere containing heavy water ($D_2O$).

17 Claims, 14 Drawing Sheets

(56) References Cited

U.S. PATENT DOCUMENTS

| | | | | |
|---|---|---|---|---|
| 2019/0279932 | A1* | 9/2019 | Wakatsuki | H10D 64/037 |
| 2021/0083128 | A1 | 3/2021 | Noguchi et al. | |
| 2023/0088074 | A1 | 3/2023 | Nakajima et al. | |

OTHER PUBLICATIONS

Wefers et al., "Oxides and Hydroxides of Aluminum", Alcoa Laboratories, Technical Paper No. 19, Revised, 1987, 100 pages.
Chaudhuri, et al., "Thermal Oxidation of Single Crystalline Aluminum Nitride", Materials Characterization 58, 2007, 8 pages.

* cited by examiner

METHOD FOR MANUFACTURING OXIDE FILM, METHOD FOR MANUFACTURING SEMICONDUCTOR MEMORY DEVICE, SEMICONDUCTOR DEVICE, AND SEMICONDUCTOR MEMORY DEVICE

CROSS-REFERENCE TO RELATED APPLICATION

This application is based upon and claims the benefit of priority from Japanese Patent Application No. 2022-039793, filed on Mar. 15, 2022, the entire contents of which are incorporated herein by reference.

FIELD

Embodiments described herein relate generally to a method for manufacturing an oxide film, a method for manufacturing a semiconductor memory device, a semiconductor device, and a semiconductor memory device.

BACKGROUND

For example, a logic device includes a miniaturized metal oxide semiconductor field effect transistor (MOSFET) in order to improve performance of the device. In the miniaturized MOSFET, a gate insulating layer having a small thickness and a small leakage current is required.

A three-dimensional NAND flash memory in which memory cells are three-dimensionally arranged realizes a high degree of integration and low cost. In the three-dimensional NAND flash memory, for example, a memory hole penetrating a stacked body is formed in the stacked body in which a plurality of insulating layers and a plurality of gate electrode layers are alternately stacked. A memory string in which a plurality of memory cells are connected in series is formed by forming a charge storage layer and a semiconductor layer in the memory hole. The memory cell has a block insulating layer for suppressing escaping of charges retained in the charge storage layer to a gate electrode. In order to miniaturize the memory cell, a block insulating layer having a small thickness and a small leakage current is required.

DETAILED DESCRIPTION

Figure 1A:
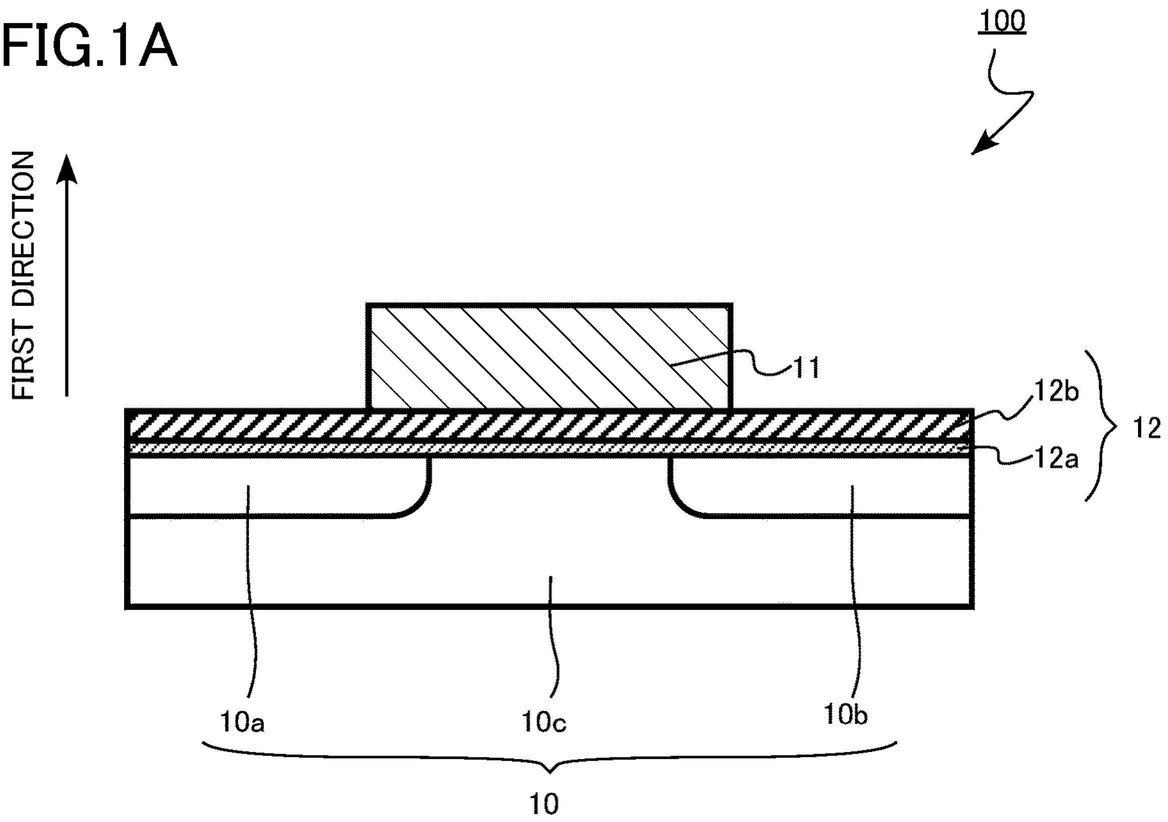
FIGS. 1A and 1B are schematic cross-sectional views of a semiconductor device according to a first embodiment.

In a method for manufacturing an oxide film according to an embodiment, a first film containing aluminum (Al) and nitrogen (N) is formed, and a second film containing aluminum (Al) and oxygen (O) is formed by oxidizing the first film in an atmosphere containing heavy water ($D_2O$).

Hereinafter, embodiments of the present disclosure will be described with reference to the drawings. In the following description, the same or similar members will be denoted by the same reference numerals, and the description of the members once described will be appropriately omitted.

Qualitative analysis and quantitative analysis of chemical compositions of members constituting a semiconductor device or a semiconductor memory device in the present specification can be performed by, for example, secondary ion mass spectroscopy (SIMS), energy dispersive X-ray spectroscopy (EDX), electron energy loss spectroscopy (EELS), X-ray photoelectron spectroscopy (XPS), or the like. For example, thicknesses of the members constituting the semiconductor device and the semiconductor memory device, a distance between the members, and the like can be measured by using a transmission electron microscope (TEM). For identification of a crystal system of a constituent substance of the member constituting the semiconductor device or the semiconductor memory device and comparison in magnitude of an abundance of the crystal system, it is possible to use, for example, a transmission electron microscope, X-ray diffraction (XRD), electron beam diffraction (EBD), X-ray photoelectron spectroscopy, or synchrotron radiation X-ray absorption fine structure (XAFS).

First Embodiment

A semiconductor device according to a first embodiment includes a semiconductor layer, a gate electrode layer; and an insulating layer provided between the semiconductor layer and the gate electrode layer, the insulating layer containing an aluminum oxide, the aluminum oxide including at least one crystal phase selected from the group consisting of an alpha ($\alpha$)-aluminum oxide and a theta ($\theta$)-aluminum oxide, and the insulating layer containing a compound of deuterium (D) and oxygen (O).

In a method for manufacturing an oxide film according to the first embodiment, a first film containing aluminum (Al)

and nitrogen (N) is formed, and a second film containing aluminum (Al) and oxygen (O) is formed by oxidizing the first film in an atmosphere containing heavy water ($D_2O$).

Figure 1B:
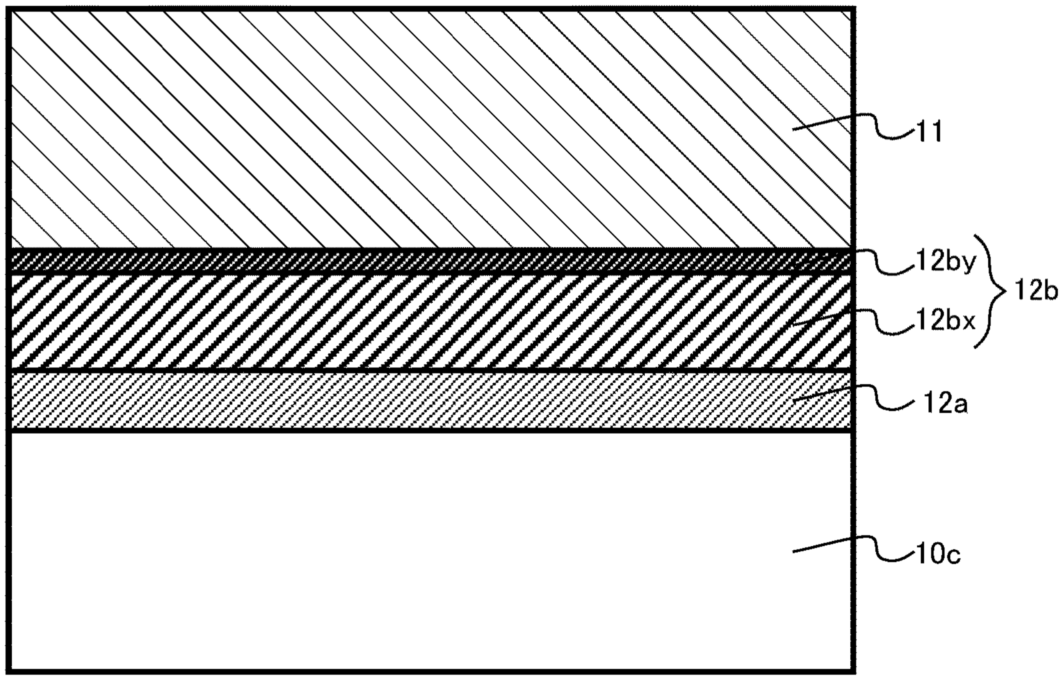

FIGS. 1A and 1B are schematic cross-sectional views of the semiconductor device according to the first embodiment. FIG. 1B is an enlarged view of a part of FIG. 1A.

The semiconductor device according to the first embodiment is a MOSFET 100. The MOSFET 100 is a MOSFET having a planar gate structure.

The MOSFET 100 includes a semiconductor layer 10, a gate electrode layer 11, and a gate insulating layer 12. The semiconductor layer 10 includes a source region 10*a*, a drain region 10*b*, and a channel region 10*c*. The gate insulating layer 12 includes a lower layer 12*a* and an upper layer 12*b*. The upper layer 12*b* includes a first region 12*bx* and a second region 12*by*.

The upper layer 12*b* is an example of an insulating layer.

The semiconductor layer 10 is a semiconductor. The semiconductor layer 10 is, for example, a single crystal. The semiconductor layer 10 is, for example, silicon. The semiconductor layer 10 is, for example, an oxide semiconductor.

The semiconductor layer 10 includes a source region 10*a*, a drain region 10*b*, and a channel region 10*c*. The channel region 10*c* is provided between the source region 10*a* and the drain region 10*b*.

The source region 10*a* and the drain region 10*b* are, for example, n-type semiconductors. The channel region 10*c* is, for example, a p-type semiconductor.

The gate electrode layer 11 is a conductor. The gate electrode layer 11 includes, for example, a metal, a metal semiconductor compound, or a semiconductor containing conductive impurities.

The gate insulating layer 12 is provided between the semiconductor layer 10 and the gate electrode layer 11. The gate insulating layer 12 includes a lower layer 12*a* and an upper layer 12*b*.

The upper layer 12*b* is provided between the semiconductor layer 10 and the gate electrode layer 11. The lower layer 12*a* is provided between the semiconductor layer 10 and the upper layer 12*b*.

The lower layer 12*a* is an insulator. The lower layer 12*a* contains, for example, silicon (Si) and oxygen (O). The lower layer 12*a* contains, for example, a silicon oxide. The lower layer 12*a* is, for example, a silicon oxide layer.

The lower layer 12*a* has, for example, a function of reducing an interface state of an interface between the semiconductor layer 10 and the gate insulating layer 12.

A thickness of the lower layer 12*a* in a first direction from the semiconductor layer 10 toward the gate electrode layer 11 is, for example, equal to or more than 0.3 nm and equal to or less than 2 nm.

The upper layer 12*b* is an insulator. The upper layer 12*b* contains aluminum oxide. The upper layer 12*b* is, for example, an aluminum oxide layer.

The aluminum oxide contained in the upper layer 12*b* contains at least one crystal phase selected from the group consisting of an alpha (α)-aluminum oxide and a theta (θ)-aluminum oxide. The aluminum oxide contained in the upper layer 12*b* includes an α-aluminum oxide or a θ-aluminum oxide or both α-aluminum oxide and θ-aluminum oxide.

The aluminum oxide contained in the upper layer 12*b* contains, as a main component, an α-aluminum oxide or a θ-aluminum oxide. The fact that the aluminum oxide contained in the upper layer 12*b* contains, as a main component, an α-aluminum oxide or a θ-aluminum oxide means that a molar fraction occupied by an α-aluminum oxide or a θ-aluminum oxide is the highest among the aluminum oxides contained in the upper layer 12*b*.

The α-aluminum oxide has a trigonal crystal structure and is Space Group 167: R-3c. The θ-aluminum oxide has a monoclinic crystal structure and has Space Group 12: C2/m.

The aluminum oxide contained in the upper layer 12*b* may contain gamma (γ)-aluminum oxide. The γ-aluminum oxide has a cubic crystal structure and is Space Group 227: Fd3m.

The α-aluminum oxide is also referred to as α-alumina, the θ-aluminum oxide is also referred to as θ-alumina, and the γ-aluminum oxide is also referred to as γ-alumina. The α-aluminum oxide and the θ-aluminum oxide are represented by, for example, $Al_2O_3$ in a chemical formula.

The upper layer 12*b* contains a compound of deuterium (D) and oxygen (O). The compound of deuterium (D) and oxygen (O) is, for example, heavy water ($D_2O$) or DHO.

The upper layer 12*b* includes a first region 12*bx* and a second region 12*by*. The second region 12*by* is provided between the first region 12*bx* and the gate electrode layer 11.

The second region 12*by* contains, for example, γ-aluminum oxide. The molar fraction of the γ-aluminum oxide contained in the second region 12*by* is, for example, larger than a molar fraction of γ-aluminum oxide contained in the first region 12*bx*.

For crystals of the aluminum oxide in the upper layer 12*b*, a median value of inclination angles of a predetermined crystal axis with respect to the first direction is, for example, equal to or less than 10 degrees. That is, the aluminum oxide in the upper layer 12*b* is, for example, uniaxially oriented. A median value of inclination angles of c-axis of the aluminum oxide in the upper layer 12*b* with respect to the first direction is, for example, equal to or less than 10 degrees. For example, for the α-aluminum oxide or the γ-aluminum oxide among the aluminum oxides in the upper layer 12*b*, a median value of inclination angles of a trilateral symmetry axis which is a c-axis with respect to the first direction is, for example, equal to or less than 10 degrees.

An angle between the direction of the crystal axis of the aluminum oxide in the upper layer 12*b* and the first direction can be determined, for example, by comparing an array direction of spots obtained by performing fast Fourier transform analysis on a TEM image of a cross section of the upper layer 12*b* with the first direction. A median value can be obtained by measuring a plurality of the above angles.

A thickness of the upper layer 12*b* in the first direction from the semiconductor layer 10 toward the gate electrode layer 11 is, for example, equal to or more than 0.5 nm and equal to or less than 5 nm.

The upper layer 12*b* contains, for example, at least one element of hafnium (Hf), zirconium (Zr), and silicon (Si).

In the MOSFET 100, the lower layer 12*a* may be omitted, and the upper layer 12*b* may be in contact with the semiconductor layer 10.

Next, a method for manufacturing a semiconductor device and a method for manufacturing an oxide film according to the first embodiment will be described.

FIGS. 2A, 2B, 2C, and 2D are explanatory diagrams of the method for manufacturing a semiconductor device and the method for manufacturing an oxide film according to the first embodiment.

First, a p-type single crystal silicon layer 50 is prepared. The single crystal silicon layer 50 is an example of a semiconductor layer.

Figure 2A:
FIGS. 2A, 2B, 2C, and 2D are explanatory diagrams of a method for manufacturing a semiconductor device and a method for manufacturing an oxide film according to the first embodiment.

Subsequently, a silicon oxide film 51 is formed on the single crystal silicon layer 50 (FIG. 2A). The silicon oxide film 51 is formed, for example, by thermally oxidizing a surface of the single crystal silicon layer 50. The silicon oxide film 51 finally becomes the lower layer 12*a*. A thickness of the silicon oxide film 51 is, for example, equal to or more than 0.3 nm and equal to or less than 2 nm.

Figure 2B:
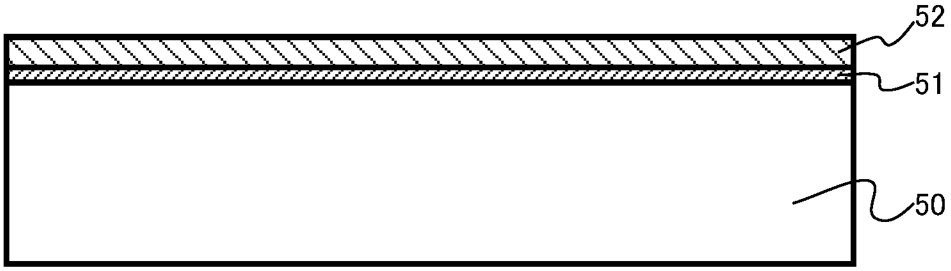

Subsequently, an aluminum nitride film 52 is formed on the silicon oxide film 51 (FIG. 2B). The aluminum nitride film 52 is an example of a first film containing aluminum (Al) and nitrogen (N).

The first film is a film containing, as main components, aluminum (Al) and nitrogen (N). The fact that the first film is the film containing, as the main components, aluminum (Al) and nitrogen (N) means that an element having a concentration higher than concentrations of aluminum (Al) and nitrogen (N) is not present among elements contained in the first film.

The first film may contain at least one element of hafnium (Hf), zirconium (Zr), and silicon (Si). The aluminum nitride film 52 may contain at least one element of hafnium (Hf), zirconium (Zr), and silicon (Si).

A thickness of the aluminum nitride film 52 is, for example, equal to or more than 0.5 nm and equal to or less than 5 nm. The aluminum nitride film 52 is formed by, for example, an atomic layer deposition (ALD) method.

Figure 2C:
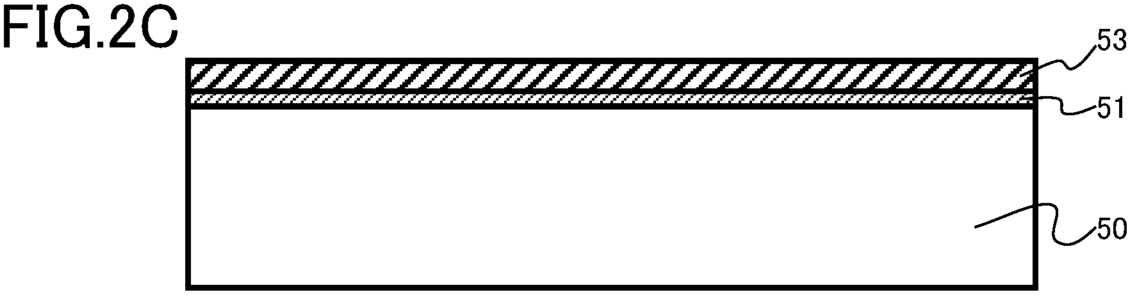

Subsequently, the aluminum nitride film 52 is oxidized to form an aluminum oxide film 53 (FIG. 2C). The aluminum oxide film 53 is an example of a second film containing aluminum (Al) and oxygen (O). The aluminum oxide film 53 is an example of an oxide film.

The second film is a film containing, as main components, aluminum (Al) and oxygen (O). The fact that the second film is the film containing, as the main components, aluminum (Al) and oxygen (O) means that an element having a concentration higher than concentrations of aluminum (Al) and oxygen (O) is not present among elements contained in the second film.

The aluminum nitride film 52 is oxidized in an atmosphere containing heavy water ($D_2O$). The aluminum nitride film 52 is oxidized, for example, in an atmosphere supplied with a process gas containing a deuterium ($D_2$) gas and an oxygen ($O_2$) gas. For example, heavy water ($D_2O$) is generated in the atmosphere by the reaction of deuterium ($D_2$) gas and oxygen ($O_2$) gas. A molar fraction of deuterium ($D_2$) gas in a process gas is equal to or more than 5% and equal to or less than 15%.

The aluminum nitride film 52 is oxidized by, for example, In-Situ Steam Generation (ISSG) oxidation.

When the aluminum nitride film 52 is oxidized, it is considered that the α-aluminum oxide or the θ-aluminum oxide is mainly formed at an interface between the aluminum nitride and the aluminum oxide formed by oxidizing the aluminum nitride. On the other hand, it is considered that γ-aluminum oxide is mainly formed on a surface of the formed aluminum oxide.

The aluminum oxide film 53 finally becomes the upper layer 12*b*. The lower layer 12*a* and the upper layer 12*b* serve as the gate insulating layer 12.

Figure 2D:
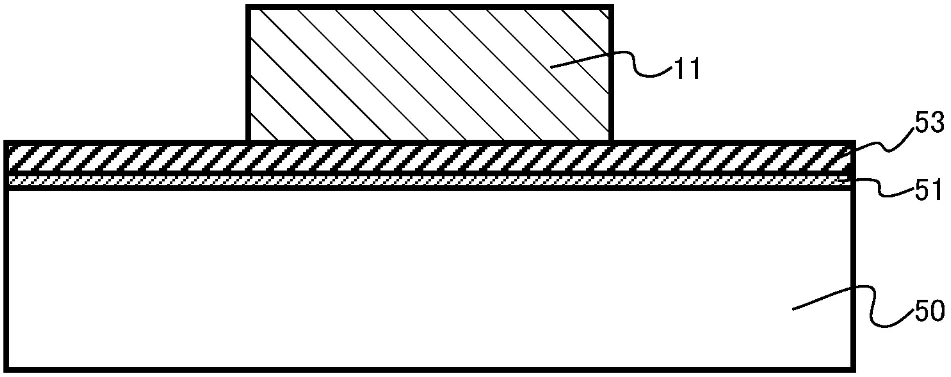

Subsequently, the gate electrode layer 11 is formed on the aluminum oxide film 53 by a known process technique (FIG. 2D). Thereafter, an n-type impurity region is formed in the single crystal silicon layer 50 by using an ion implantation method. The n-type impurity region is the source region 10*a* and the drain region 10*b*.

The MOSFET 100 illustrated in FIGS. 1A and 1B is manufactured by the above manufacturing method.

Next, functions and effects of the semiconductor device and the method for manufacturing an oxide film according to the first embodiment will be described.

For example, a logic device includes a miniaturized MOSFET for high performance of the device. In the miniaturized MOSFET, a gate insulating layer having a small thickness and a small leakage current is required.

In the MOSFET 100 according to the first embodiment, the gate insulating layer 12 has a thin upper layer 12*b* having a thickness of 5 nm or less. The aluminum oxide contained in the upper layer 12*b* contains at least one crystal phase selected from the group consisting of an α-aluminum oxide and a θ-aluminum oxide. The aluminum oxide contained in the upper layer 12*b* contains an α-aluminum oxide, a θ-aluminum oxide, or both an α-aluminum oxide and a θ-aluminum oxide, and thus, a leakage current of the upper layer 12*b* is reduced. Thus, a leakage current of the gate insulating layer 12 is reduced. It is considered that the α-aluminum oxide and the θ-aluminum oxide have a leakage current smaller than a leakage current of another crystal phase, for example, a γ-aluminum oxide.

The upper layer 12*b* of the MOSFET 100 according to the first embodiment contains a compound of deuterium (D) and oxygen (O). The compound of deuterium (D) and oxygen (O) is, for example, heavy water ($D_2O$) or DHO. The compound of deuterium (D) and oxygen (O) contained in the upper layer 12*b* is derived from, for example, heavy water ($D_2O$) used for forming the upper layer 12*b*.

The compound of deuterium (D) and oxygen (O) contained in the upper layer 12*b* terminates, for example, a dangling bond contained in the upper layer 12*b*. Accordingly, the leakage current of the upper layer 12*b* is reduced. Thus, the leakage current of the gate insulating layer 12 is further reduced.

From the viewpoint of reducing the leakage current of the gate insulating layer 12, at least one crystal phase selected from the group consisting of an α-aluminum oxide and a θ-aluminum oxide among the crystal phases of the aluminum oxides contained in the upper layer 12*b* is preferably the main crystal phase. The term "main crystal phase" means that the at least one of the crystal phases has an abundance higher than an abundance of another crystal phase. Among the crystal phases of the aluminum oxides contained in the upper layer 12*b*, the α-aluminum oxide is more preferably the main crystal phase.

The second region 12*by* of the upper layer 12*b* preferably contains the γ-aluminum oxide. The molar fraction of the γ-aluminum oxide contained in the second region 12*by* is preferably larger than the molar fraction of the γ-aluminum oxide contained in the first region 12*bx*.

The γ-aluminum oxide is present on a surface of the gate insulating layer 12 close to the gate electrode layer 11, and thus, roughness of the surface of the gate insulating layer 12 increases. The roughness of the surface of the gate insulating layer 12 increases, and thus, it is easy to form the film on the surface of the gate insulating layer 12. For example, the film to be the gate electrode layer 11 can be easily formed.

The median value of the inclination angles of the direction of the predetermined crystal axis of the aluminum oxide in the upper layer 12*b* with respect to the first direction is preferably equal to or less than 10 degrees. That is, the aluminum oxide in the upper layer 12*b* is preferably uniaxially oriented. The median value of the inclination angles of c-axis of the aluminum oxide in the upper layer 12*b* with respect to the first direction is preferably equal to or less than 10 degrees. For example, for the α-aluminum oxide or the γ-aluminum oxide among the aluminum oxides in the upper layer 12*b*, the median value of the inclination angles of the trilateral symmetry axis as the c-axis with respect to the first direction is preferably equal to or less than 10 degrees.

The aluminum oxide in the upper layer 12*b* is uniaxially oriented, and thus, the leakage current of the upper layer 12*b* is reduced. It is considered that the leakage current can be reduced by increasing the crystallinity of the aluminum oxide in the upper layer 12*b*.

The upper layer 12*b* preferably contains at least one element of hafnium (Hf), zirconium (Zr), and silicon (Si). The upper layer 12*b* contains hafnium (Hf) or zirconium (Zr), and thus, a dielectric constant of the upper layer 12*b* increases. Accordingly, a dielectric constant of the gate insulating layer 12 increases.

The upper layer 12*b* contains silicon (Si), and thus, a defect density in the upper layer 12*b* is reduced. Accordingly, the leakage current of the upper layer 12*b* is reduced. Thus, the leakage current of the gate insulating layer 12 is further reduced.

The gate insulating layer 12 according to the first embodiment is formed by using the method for manufacturing an oxide film according to the first embodiment. In the method for manufacturing an oxide film according to the first embodiment, an oxide film containing aluminum (Al) and oxygen (O) is formed by oxidizing the film containing aluminum (Al) and nitrogen (N) in the atmosphere containing heavy water ($D_2O$). For example, the aluminum oxide film is formed by oxidizing the aluminum nitride film.

According to this manufacturing method, the leakage current can be reduced even when the aluminum oxide film is as thin as 5 nm or less. For example, as compared with an aluminum oxide film having the same film thickness formed by a chemical vapor deposition method (CVD method), the aluminum oxide film manufactured by the manufacturing method according to the first embodiment can reduce the leakage current by one digit or more.

For example, it is considered that the aluminum oxide film is formed by oxidizing the aluminum nitride film in an atmosphere containing water vapor ($H_2O$) instead of heavy water ($D_2O$). In a case where the aluminum oxide film is formed by oxidizing the aluminum nitride film, it is considered that the α-aluminum oxide or the θ-aluminum oxide is mainly formed at the interface between the aluminum nitride and the aluminum oxide. On the other hand, it is considered that γ-aluminum oxide is mainly formed on a surface of the formed aluminum oxide.

In a case where the aluminum nitride film is oxidized in an atmosphere containing water vapor ($H_2O$), diffusion of oxygen in the formed aluminum oxide is promoted by hydrogen (H) present in the atmosphere. Thus, the formation of the α-aluminum oxide or the θ-aluminum oxide at the interface between the aluminum nitride and the aluminum oxide is promoted rather than the formation of the γ-aluminum oxide on the surface of the aluminum oxide. Accordingly, an oxide film having a high molar fraction of the α-aluminum oxide or the θ-aluminum oxide is formed. Thus, it is possible to realize an oxide film with reduced leakage current.

However, in a case where the aluminum nitride film is oxidized in an atmosphere containing water vapor ($H_2O$), when the aluminum nitride film having a certain thickness or more is oxidized, the flatness of the surface of the aluminum oxide film rapidly degrades, and it becomes difficult to form an oxide film having a low leakage current. For example, when the thickness of the aluminum nitride film is more than 2.5 nm, it is difficult to form an oxide film having a low leakage current.

In the method for manufacturing an oxide film according to the first embodiment, an aluminum oxide film is formed by oxidizing an aluminum nitride film in an atmosphere containing heavy water ($D_2O$). By using heavy water ($D_2O$), the degradation of the flatness of the surface of the aluminum oxide film is suppressed even in a case where the aluminum nitride film having a certain thickness or more is oxidized. Accordingly, an oxide film having a low leakage current can be formed.

It is considered that the reason why the flatness of the surface of the aluminum oxide film rapidly degrades when water vapor ($H_2O$) is used is that a nitrogen gas generated inside the film cannot diffuse outward from the surface of the film due to the oxidation at the interface between the aluminum nitride and the aluminum oxide and stays on the surface of the film. For example, it is considered that the nitrogen gas retained on the surface of the film is foamed, and the flatness of the surface of the aluminum oxide film rapidly degrades.

Deuterium (D) having a mass larger than a mass of hydrogen (H) is present in an atmosphere containing heavy water ($D_2O$). Like the hydrogen (H), the deuterium (D) promotes the diffusion of the oxygen in the formed aluminum oxide. However, the deuterium (D) has a mass larger than a mass of the hydrogen (H), and thus, the diffusion of the oxygen in the aluminum oxide is slower than in a case where the hydrogen (H) is present.

Thus, an oxidation rate is reduced, and the generation of the nitrogen gas generated inside the film is also suppressed along with the oxidation at the interface between the aluminum nitride and the aluminum oxide. Accordingly, the staying of the nitrogen gas generated inside the film on the surface of the film is suppressed. Thus, it is considered that the degradation of the flatness of the surface of the aluminum oxide film is suppressed.

In the manufacturing method according to the first embodiment, from the viewpoint of reducing the leakage current of the gate insulating layer 12, an oxidation temperature of the aluminum nitride film is preferably equal to or more than 950° C. and equal to or less than 1100° C., and more preferably equal to or more than 1000° C. and equal to or less than 1050° C.

In the manufacturing method according to the first embodiment, the aluminum nitride film is preferably oxidized by In-Situ Steam Generation (ISSG) oxidation from the viewpoint of reducing the leakage current of the gate insulating layer 12.

In the manufacturing method according to the first embodiment, from the viewpoint of reducing the leakage current of the gate insulating layer 12, the molar fraction of the deuterium ($D_2$) gas in the process gas supplied to the atmosphere at the time of oxidation is preferably equal to or more than 5% and equal to or less than 15%.

As described above, according to the first embodiment, it is possible to provide a semiconductor device including an oxide film having a small leakage current. According to the first embodiment, it is possible to provide a method for manufacturing an oxide film having a small leakage current.

Second Embodiment

A semiconductor memory device according to a second embodiment includes a semiconductor layer extending in a first direction, a gate electrode layer, a charge storage layer provided between the semiconductor layer and the gate electrode layer, a first insulating layer provided between the semiconductor layer and the charge storage layer, and a second insulating layer provided between the charge storage layer and the gate electrode layer and containing aluminum oxide, the aluminum oxide containing at least one crystal phase selected from the group consisting of an alpha (α)-aluminum oxide and a theta (θ)-aluminum oxide, and containing a compound of deuterium (D) and oxygen (O).

A method for manufacturing a semiconductor memory device according to the second embodiment includes forming a stacked structure in which an oxide layer and a nitride layer are alternately stacked in a first direction, forming a hole extending in the first direction in the stacked structure, forming a charge storage layer inside the hole, forming a first insulating film inside the hole, forming a semiconductor layer inside the hole, selectively removing the nitride layer with respect to the oxide layer, forming a first film containing aluminum (Al) and nitrogen (N) in a region in which the nitride layer is removed, oxidizing the first film in an atmosphere containing heavy water ($D_2O$), forming a second film containing aluminum (Al) and oxygen (O), and forming a conductive film in the region.

The semiconductor memory device according to the second embodiment is a three-dimensional NAND flash memory. A memory cell of the semiconductor memory device according to the second embodiment is a so-called Metal-Oxide-Nitride-Oxide-Semiconductor type (MONOS type) memory cell.

A block insulating layer of the memory cell of the semiconductor memory device according to the second embodiment is formed by using the same manufacturing method as the method for manufacturing an oxide film according to the first embodiment. Hereinafter, a part of contents overlapping the contents of the first embodiment will not be described.

Figure 3:
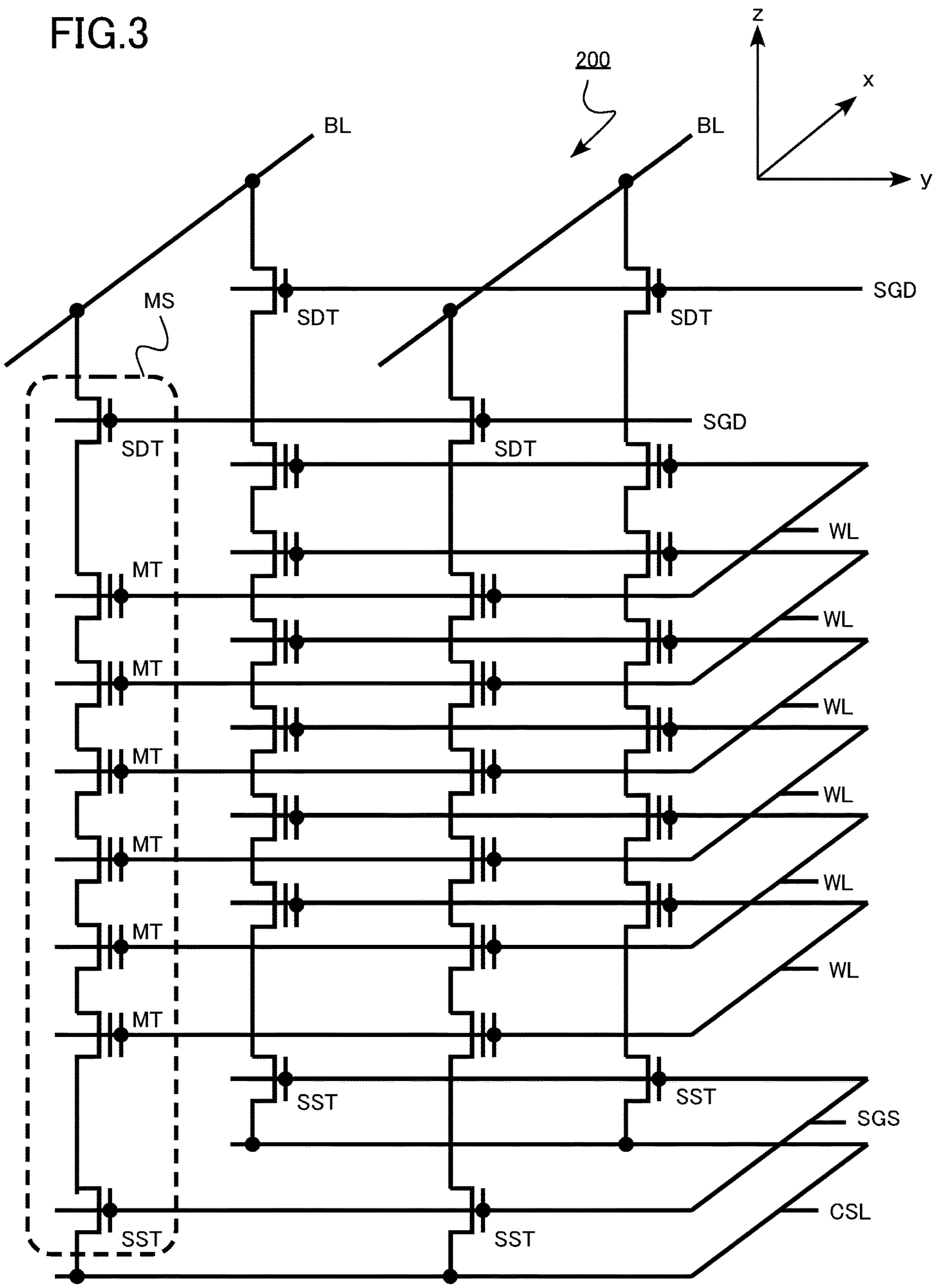
FIG. 3 is a circuit diagram of a memory cell array of a semiconductor memory device according to a second embodiment.

FIG. 3 is a circuit diagram of a memory cell array of the semiconductor memory device according to the second embodiment.

As illustrated in FIG. 3, a memory cell array 200 of the three-dimensional NAND flash memory according to the second embodiment includes a plurality of word lines WL, a common source line CSL, a source selection gate line SGS, a plurality of drain selection gate lines SGD, a plurality of bit lines BL, and a plurality of memory strings MS.

The plurality of word lines WL are arranged in a z direction while being separated from each other. The plurality of word lines WL are stacked and arranged in the z direction. The plurality of memory strings MS extend in the z direction. The plurality of bit lines BL extend in, for example, the x direction.

Hereinafter, the x direction is defined as a third direction, the y direction is defined as a second direction, and the z direction is defined as a first direction. The x direction, the y direction, and the z direction cross each other, and are, for example, perpendicular to each other.

As illustrated in FIG. 3, the memory string MS includes a source selection transistor SST, a plurality of memory cells, and a drain selection transistor SDT connected in series between the common source line CSL and the bit line BL. One memory string MS is selected by selecting one bit line BL and one drain selection gate line SGD, and one memory cell can be selected by selecting one word line WL. The word line WL is a gate electrode of a memory cell transistor MT constituting the memory cell.

Figure 4A:
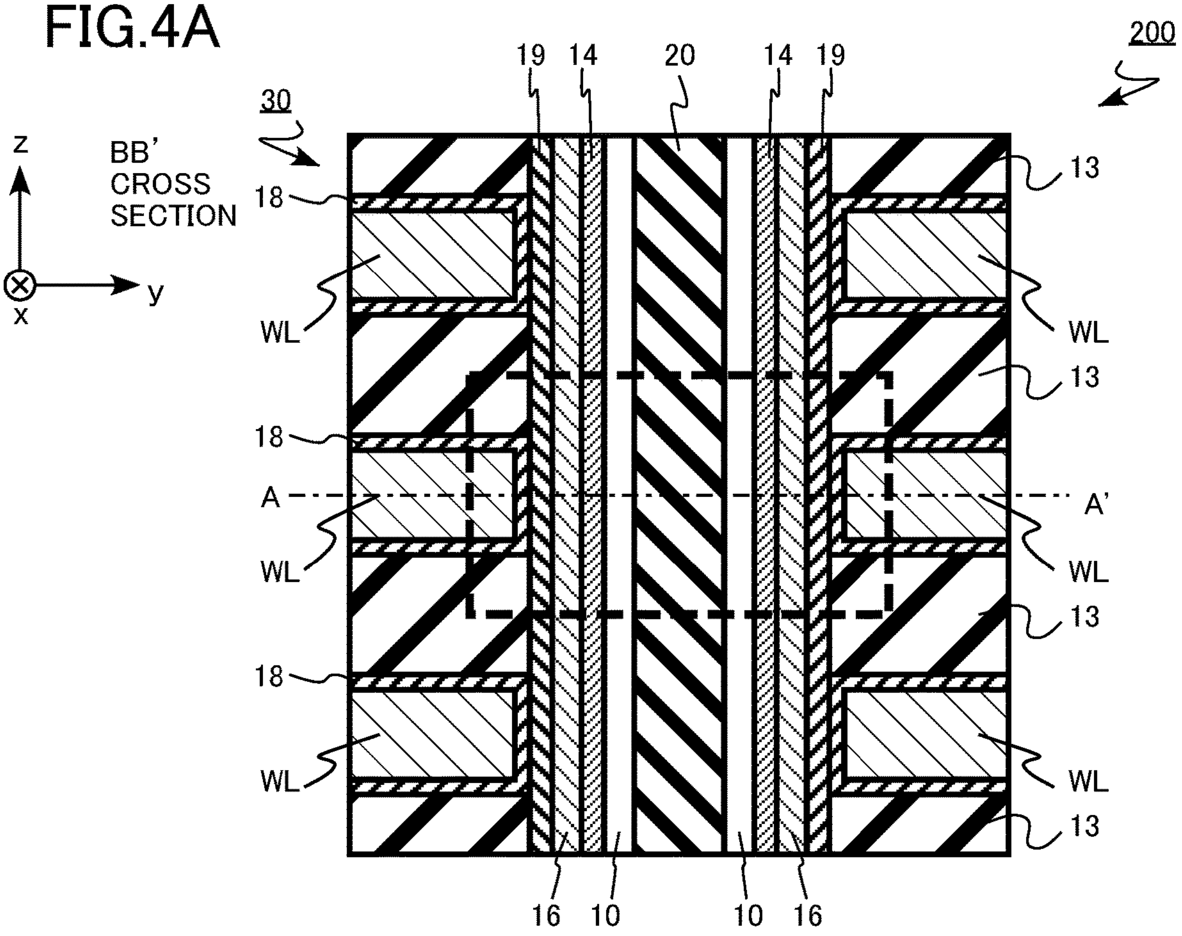
FIGS. 4A and 4B are schematic cross-sectional views of the memory cell array of the semiconductor memory device according to the second embodiment.
Figure 4B:
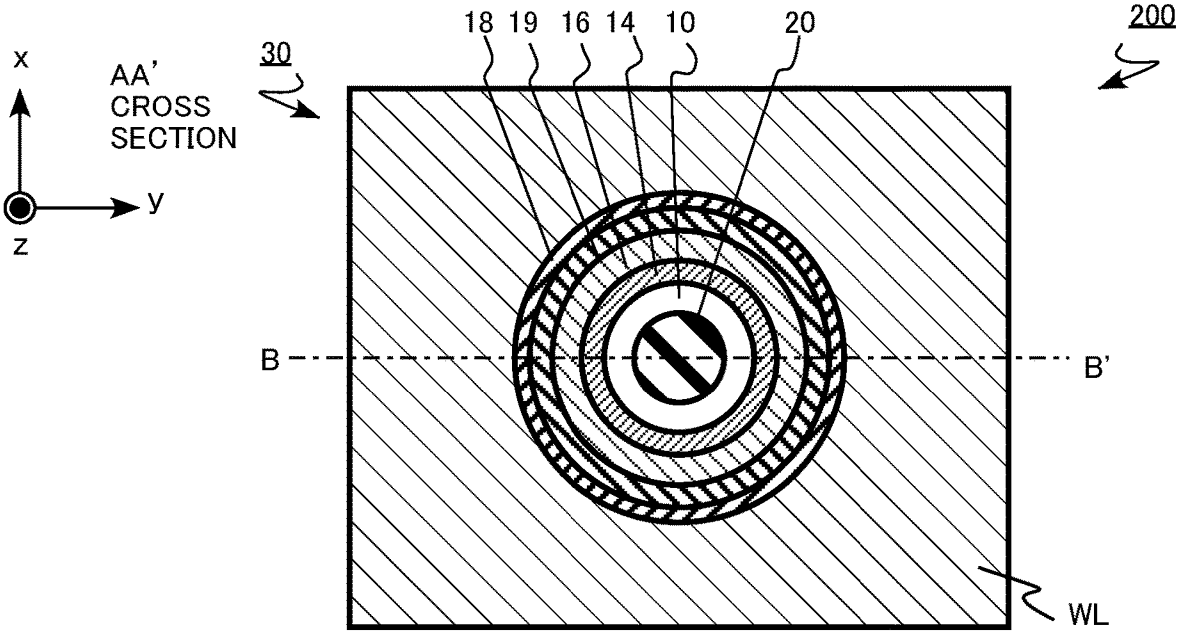

FIGS. 4A and 4B are schematic cross-sectional views of the memory cell array of the semiconductor memory device according to the second embodiment. FIGS. 4A and 4B illustrate cross sections of the plurality of memory cells in one memory string MS in the memory cell array 200 of FIG. 3.

FIG. 4A is an yz cross-sectional view of the memory cell array 200. FIG. 4A is a BB' cross section of FIG. 4B. FIG. 4B is an xy cross-sectional view of the memory cell array 200. FIG. 4B is a cross section taken along line AA' in FIG. 4A. In FIG. 4A, a region surrounded by a broken line is one memory cell.

Figure 5:
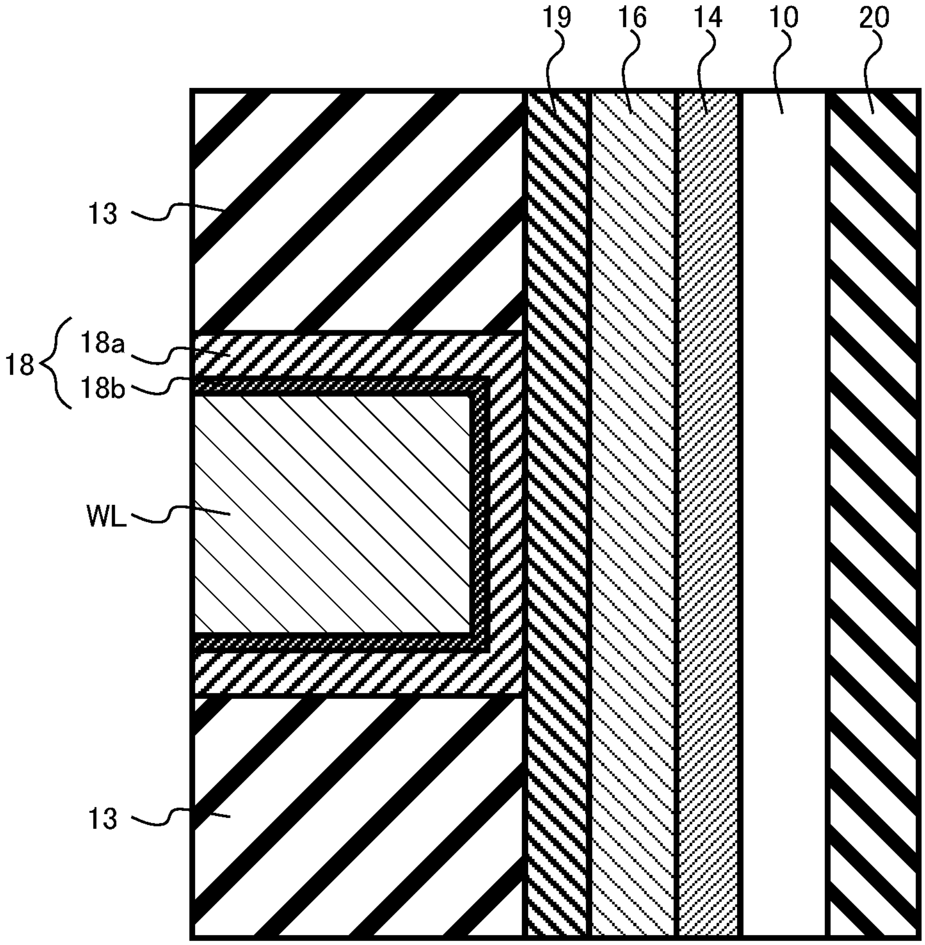
FIG. 5 is an enlarged view of a part of a memory cell of the semiconductor memory device according to the second embodiment.

FIG. 5 is an enlarged view of a part of the memory cell of the semiconductor memory device according to the second embodiment. FIG. 5 is an enlarged view of a part of FIG. 4A.

As illustrated in FIGS. 4A, 4B, and 5, the memory cell array 200 includes word lines WL, semiconductor layers 10, interlayer insulating layers 13, tunnel insulating layers 14, charge storage layers 16, first block insulating layers 18, second block insulating layers 19, and a core insulating region 20. The plurality of word lines WL and the plurality of interlayer insulating layers 13 constitute a stacked body 30. The first block insulating layer 18 includes a first region 18*a* and a second region 18*b*.

The word line WL is an example of a gate electrode layer. The interlayer insulating layer 13 is an example of a fourth insulating layer. The tunnel insulating layer 14 is an example of a first insulating layer. The first block insulating layer 18 is an example of a second insulating layer. The second block insulating layer 19 is an example of a second insulating layer or a third insulating layer.

The memory cell array 200 is provided, for example, on a semiconductor substrate (not illustrated). The semiconductor substrate has a surface parallel to the x direction and the y direction.

The word lines WL and the interlayer insulating layers 13 are alternately stacked in the z direction on the semiconductor substrate. The word lines WL are repeatedly arranged in the z direction while being separated from each other. The word line WL functions as a control electrode of the memory cell transistor MT.

The word line WL is, for example, a plate-like conductor. The word line WL includes, for example, a metal, a metal nitride, a metal carbide, or a semiconductor. The word line WL has, for example, a stacked structure of metal nitride and metal. The word line WL has, for example, a stacked structure of titanium nitride and tungsten (W). A thickness of the word line WL in the z direction is, for example, equal to or more than 5 nm and equal to or less than 20 nm.

The interlayer insulating layer 13 isolates the word line WL from the word line WL. The interlayer insulating layer 13 electrically isolates the word line WL from the word line WL.

The interlayer insulating layer 13 is, for example, an oxide, an oxynitride, or a nitride. The interlayer insulating layer 13 contains, for example, silicon (Si) and oxygen (O). The interlayer insulating layer 13 is, for example, a silicon oxide. A thickness of the interlayer insulating layer 13 in the z direction is, for example, equal to or more than 5 nm and equal to or less than 20 nm.

The semiconductor layer 10 is provided in the stacked body 30. The semiconductor layer 10 extends in the z direction. The semiconductor layer 10 extends in a direction perpendicular to the surface of the semiconductor substrate.

The semiconductor layer 10 is provided to penetrate the stacked body 30. The semiconductor layer 10 is surrounded by the plurality of word lines WL. The semiconductor layer 10 has, for example, a cylindrical shape. The semiconductor layer 10 functions as a channel of the memory cell transistor MT.

The semiconductor layer 10 is, for example, a polycrystalline semiconductor. The semiconductor layer 10 is, for example, polycrystalline silicon.

The tunnel insulating layer 14 is provided between the semiconductor layer 10 and the word line WL. The tunnel insulating layer 14 is provided between the semiconductor layer 10 and at least one of the plurality of word lines WL. The tunnel insulating layer 14 is provided between the semiconductor layer 10 and the charge storage layer 16. The tunnel insulating layer 14 has a function of causing charges to pass in accordance with a voltage applied between the word line WL and the semiconductor layer 10.

The tunnel insulating layer 14 contains, for example, silicon (Si), nitrogen (N), and oxygen (O). The tunnel insulating layer 14 includes, for example, a silicon oxide, a silicon nitride, or a silicon oxynitride. A thickness of the tunnel insulating layer 14 is, for example, equal to or more than 3 nm and equal to or less than 8 nm.

The charge storage layer 16 is provided between the tunnel insulating layer 14 and the first block insulating layer 18. The charge storage layer 16 is provided between the tunnel insulating layer 14 and the second block insulating layer 19.

The charge storage layer 16 has a function of trapping and storing charges. The charge is, for example, an electron. A threshold voltage of the memory cell transistor MT changes in accordance with the amount of charges stored in the charge storage layer 16. One memory cell can store data by using this change in the threshold voltage.

For example, the threshold voltage of the memory cell transistor MT changes, and thus, a voltage at which the memory cell transistor MT is turned on changes. For example, when a state in which the threshold voltage is high is defined as data "0" and a state in which the threshold voltage is low is defined as data "1", the memory cell can store 1-bit data of "0" and "1".

The charge storage layer 16 is, for example, an insulating layer. The charge storage layer 16 contains, for example, silicon (Si) and nitrogen (N). The charge storage layer 16 contains, for example, a silicon nitride. A thickness of the charge storage layer 16 is, for example, equal to or more than 3 nm and equal to or less than 10 nm.

The first block insulating layer 18 and the second block insulating layer 19 are provided between the tunnel insulating layer 14 and the word line WL. The first block insulating layer 18 and the second block insulating layer 19 are provided between the charge storage layer 16 and the word line WL. The first block insulating layer 18 and the second block insulating layer 19 have a function of blocking a current flowing between the charge storage layer 16 and the word line WL.

The first block insulating layer 18 is provided between the charge storage layer 16 and the word line WL. The first block insulating layer 18 is provided between the second block insulating layer 19 and the word line WL.

The interlayer insulating layer 13 is provided in the z direction of the word line WL. The word lines WL and the interlayer insulating layers 13 are arrayed in the z direction. In the z direction, the first block insulating layer 18 is provided between the word line WL and the interlayer insulating layer 13.

The first block insulating layer 18 is an insulating layer. The first block insulating layer 18 contains aluminum oxide. The first block insulating layer 18 contains aluminum oxide as a main component. The fact that the first block insulating layer 18 contains the aluminum oxide as the main component means that a molar fraction occupied by aluminum oxide is the highest among substances contained in the first block insulating layer 18. The first block insulating layer 18 is, for example, an aluminum oxide layer.

The aluminum oxide contained in the first block insulating layer 18 contains at least one crystal phase selected from the group consisting of an alpha (α)-aluminum oxide and a theta (θ)-aluminum oxide. The aluminum oxide contained in the first block insulating layer 18 includes an α-aluminum oxide, a θ-aluminum oxide, or both an α-aluminum oxide and a θ-aluminum oxide.

The aluminum oxide contained in the first block insulating layer 18 contains, as a main component, an α-aluminum oxide or a θ-aluminum oxide. The fact that the aluminum oxide contained in the upper layer **12*b* contains, as the main component, the α-type aluminum oxide or the θ-aluminum oxide means that a molar fraction occupied by the α-aluminum oxide or the θ-aluminum oxide is the highest among the aluminum oxides contained in the first block insulating layer 18**.

The α-aluminum oxide has a trigonal crystal structure and is Space Group 167: R-3c. The θ-aluminum oxide has a monoclinic crystal structure and has Space Group 12: C2/m.

The α-aluminum oxide is also referred to as α-alumina, the θ-aluminum oxide is also referred to as θ-alumina, and the γ-aluminum oxide is also referred to as γ-alumina. The α-aluminum oxide and the θ-aluminum oxide are represented by, for example, $Al_2O_3$ in a chemical formula.

The aluminum oxide contained in the first block insulating layer 18 may contain gamma (γ)-aluminum oxide. The γ-aluminum oxide has a cubic crystal structure and is Space Group 227: Fd3m.

The first block insulating layer 18 contains a compound of deuterium (D) and oxygen (O). The compound of deuterium (D) and oxygen (O) is, for example, heavy water ($D_2O$) or DHO.

The first block insulating layer 18 includes a first region **18*a* and a second region 18*b*. The second region 18*b* is provided between the first region 18*a*** and the word line WL.

The second region **18*b* includes, for example, γ-aluminum oxide. A molar fraction of the γ-aluminum oxide contained in the second region 18*b* is, for example, larger than a molar fraction of γ-aluminum oxide contained in the first region 18*a***.

The first block insulating layer 18 contains, for example, at least one element of hafnium (Hf), zirconium (Zr), and silicon (Si).

A thickness of the first block insulating layer 18 in the y direction from the semiconductor layer 10 toward the word line WL is, for example, equal to or more than 0.5 nm and equal to or less than 5 nm. A thickness of the first block insulating layer 18 in the z direction from the word line WL to the interlayer insulating layer 13 is, for example, equal to or more than 0.5 nm and equal to or less than 5 nm.

The first block insulating layer 18 may have, for example, a two-layer structure. The first block insulating layer 18 may have, for example, a two-layer structure of an aluminum oxide layer close to the word line WL and a silicon oxide layer closer to the charge storage layer 16.

The second block insulating layer 19 is provided between the charge storage layer 16 and the first block insulating layer 18. The second block insulating layer 19 is provided between the interlayer insulating layer 13 and the semiconductor layer 10. The second block insulating layer 19 is provided between the interlayer insulating layer 13 and the charge storage layer 16.

The second block insulating layer 19 is an insulating layer. The second block insulating layer 19 contains, for example, silicon (Si) and oxygen (O). The second block insulating layer 19 contains, for example, a silicon oxide. The second block insulating layer 19 is, for example, a silicon oxide layer.

The second block insulating layer 19 contains, for example, aluminum oxide. The second block insulating layer 19 includes, for example, the same material as the material of the first block insulating layer 18. The second block insulating layer 19 is, for example, an aluminum oxide layer.

A thickness of the second block insulating layer 19 in the y direction is, for example, equal to or more than 3 nm and equal to or less than 8 nm.

The second block insulating layer 19 may have, for example, a two-layer structure.

The core insulating region 20 is provided in the stacked body 30. The core insulating region 20 extends in the z direction. The core insulating region 20 is provided penetrating the stacked body 30. The core insulating region 20 is surrounded by the semiconductor layer 10. The core insulating region 20 is surrounded by the plurality of word lines WL. The core insulating region 20 has a columnar shape. The core insulating region 20 has, for example, a cylindrical shape.

The core insulating region 20 is, for example, an oxide, an oxynitride, or a nitride. The core insulating region 20 contains, for example, silicon (Si) and oxygen (O). The core insulating region 20 is, for example, a silicon oxide.

Next, an example of the method for manufacturing a semiconductor memory device according to the second embodiment will be described.

FIGS. 6, 7, 8, 9, 10, 11, 12, 13, and 14 are schematic cross-sectional views illustrating the method for manufacturing a semiconductor memory device according to the second embodiment. FIGS. 6 to 14 each illustrate a cross section corresponding to FIG. 4A. FIGS. 6 to 14 are diagrams illustrating an example of a method for manufacturing the memory cell array 200 of the semiconductor memory device.

Figure 6:
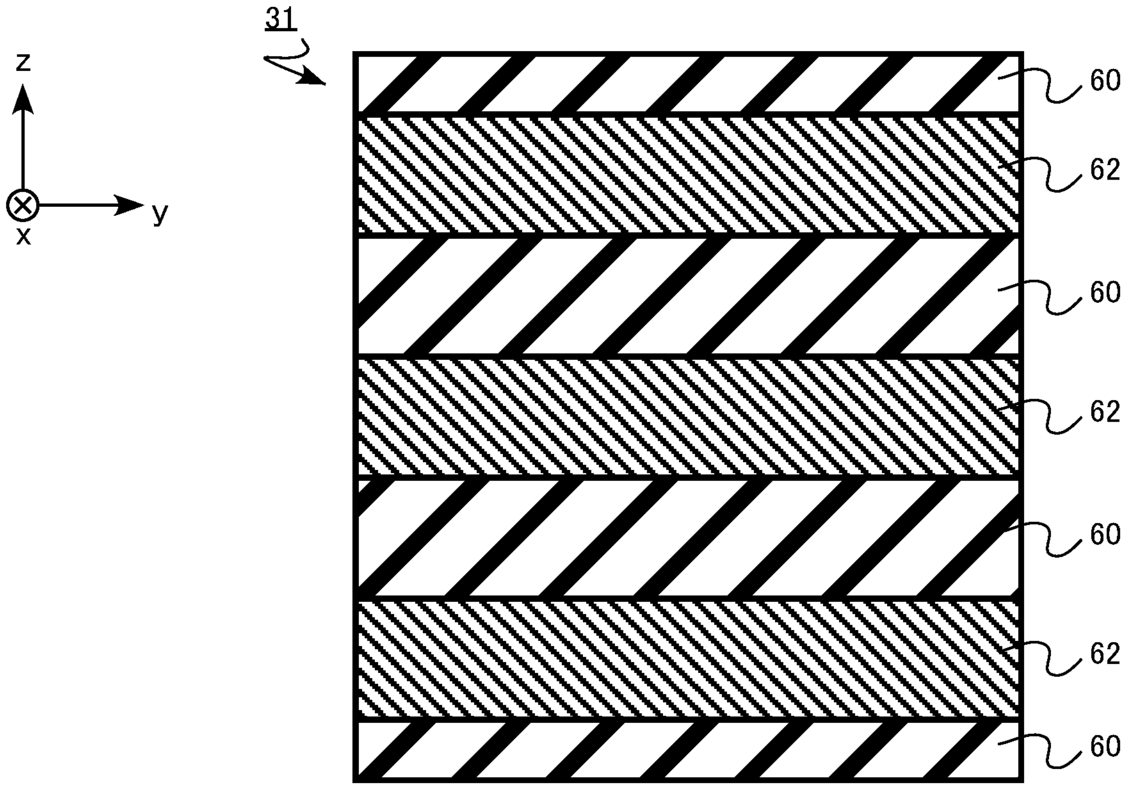
FIG. 6 is a schematic cross-sectional view illustrating an example of a method for manufacturing a semiconductor memory device according to the second embodiment.

First, silicon oxide layers 60 and silicon nitride layers 62 are alternately stacked on a semiconductor substrate (not illustrated) (FIG. 6). The silicon oxide layer 60 is an example of an oxide layer. The silicon nitride layer 62 is an example of a nitride layer.

A stacked structure 31 in which a plurality of silicon oxide layers 60 and a plurality of silicon nitride layers 62 are alternately stacked in the z direction is formed. A part of the stacked structure 31 finally becomes a part of the stacked body 30.

The silicon oxide layers 60 and the silicon nitride layers 62 are formed by, for example, a chemical vapor deposition method (CVD method). A part of the silicon oxide layer 60 finally becomes the interlayer insulating layer 13.

Figure 7:
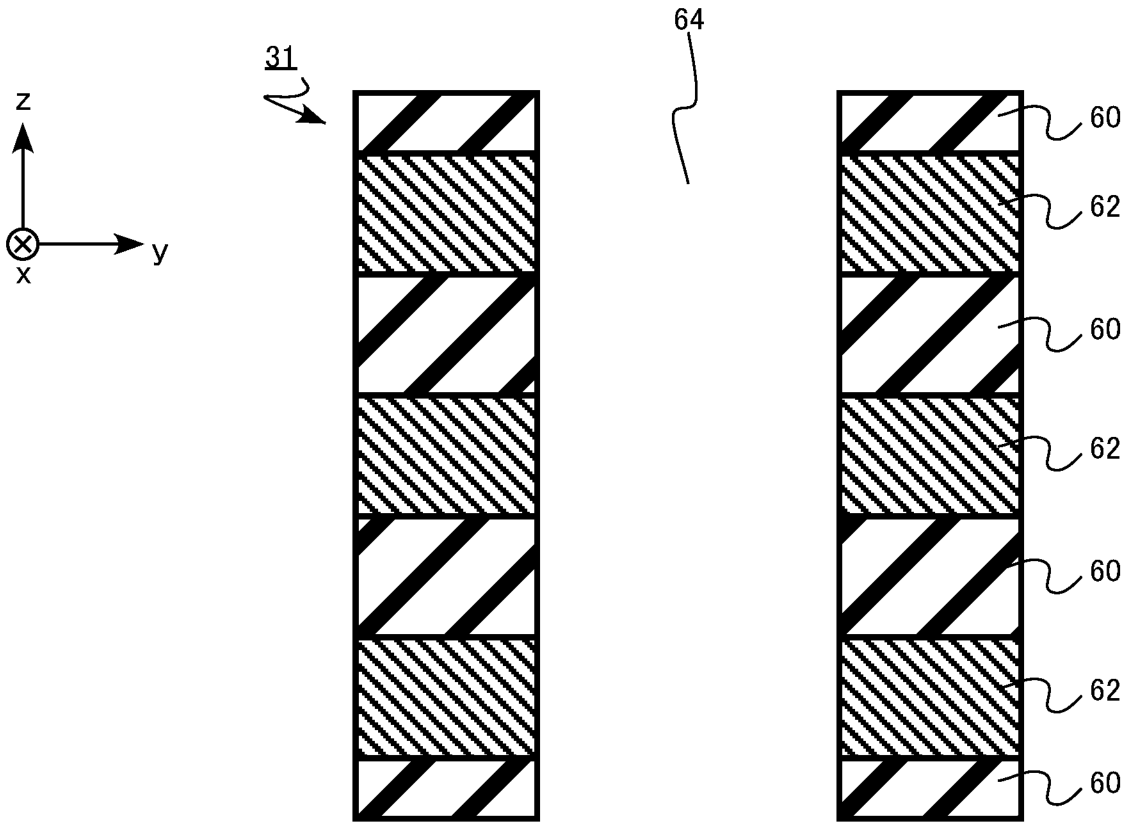
FIG. 7 is a schematic cross-sectional view illustrating an example of the method for manufacturing a semiconductor memory device according to the second embodiment.

Subsequently, a memory hole 64 is formed in the silicon oxide layers 60 and the silicon nitride layers 62 (FIG. 7). The memory hole 64 is an example of a hole. The memory hole 64 penetrates the stacked structure 31 and extends in the z direction. The memory hole 64 is formed by, for example, a lithography method and a reactive ion etching method (RIE method).

Figure 8:
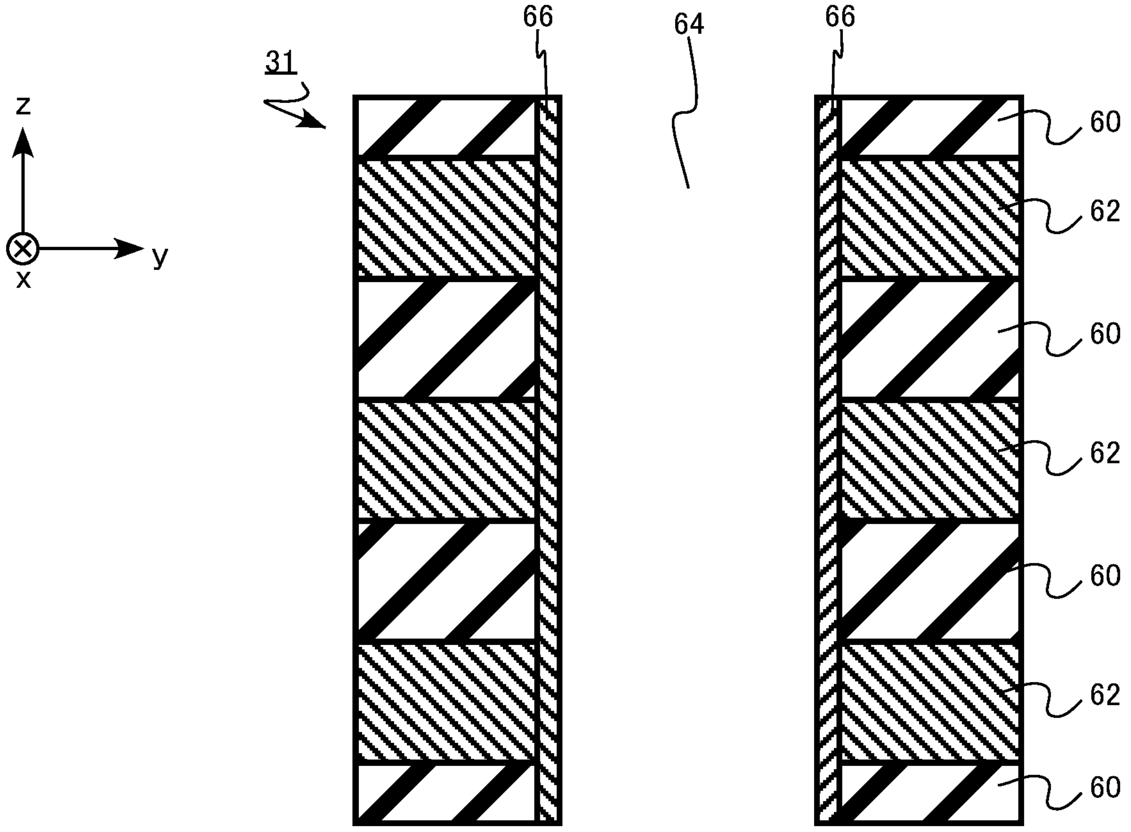
FIG. 8 is a schematic cross-sectional view illustrating an example of the method for manufacturing a semiconductor memory device according to the second embodiment.

Subsequently, a silicon oxide film 66 is formed inside the memory hole 64 (FIG. 8). The silicon oxide film 66 is an example of a second insulating film. The silicon oxide film 66 is formed by, for example, the CVD method. The silicon oxide film 66 finally becomes the second block insulating layer 19.

Subsequently, a silicon nitride film 68 is formed inside the memory hole 64. The silicon nitride film 68 is an example of a charge storage layer. The silicon nitride film 68 is formed on the silicon oxide film 66. The silicon nitride film 68 is formed by, for example, the ALD method. The silicon nitride film 68 finally becomes the charge storage layer 16.

Subsequently, a stacked insulating film 70 is formed inside the memory hole 64. The stacked insulating film 70 is an example of a first insulating film. The stacked insulating film 70 is formed on the silicon nitride film 68. The stacked insulating film 70 is, for example, a silicon oxide film or a stacked film of a silicon nitride film and a silicon oxide film.

The stacked insulating film 70 is formed by, for example, the CVD method. The stacked insulating film 70 finally becomes the tunnel insulating layer 14.

Figure 9:
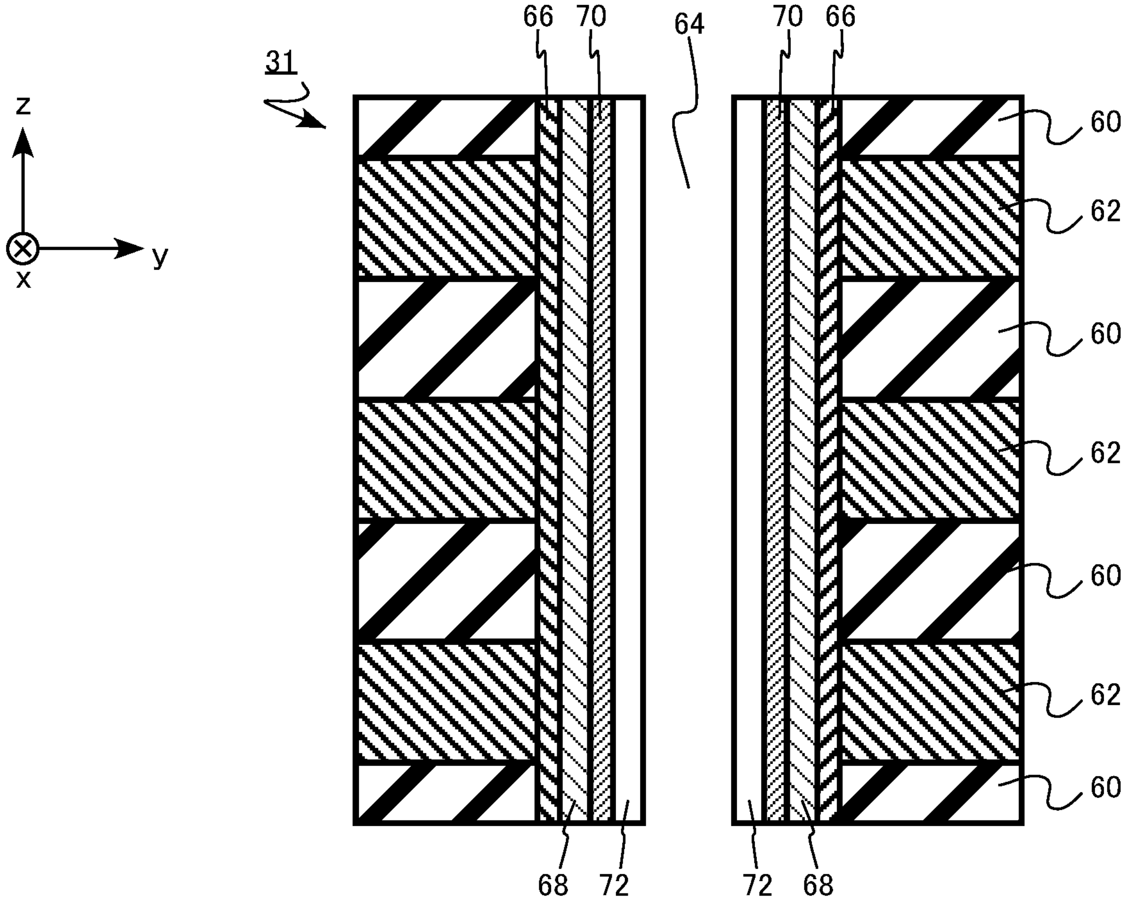
FIG. 9 is a schematic cross-sectional view illustrating an example of the method for manufacturing a semiconductor memory device according to the second embodiment.

Subsequently, a polycrystalline silicon film 72 is formed inside the memory hole 64 (FIG. 9). The polycrystalline silicon film 72 is an example of a semiconductor layer. The polycrystalline silicon film 72 is formed on the stacked insulating film 70. The polycrystalline silicon film 72 is formed by, for example, the CVD method. The polycrystalline silicon film 72 finally becomes the semiconductor layer 10.

Figure 10:
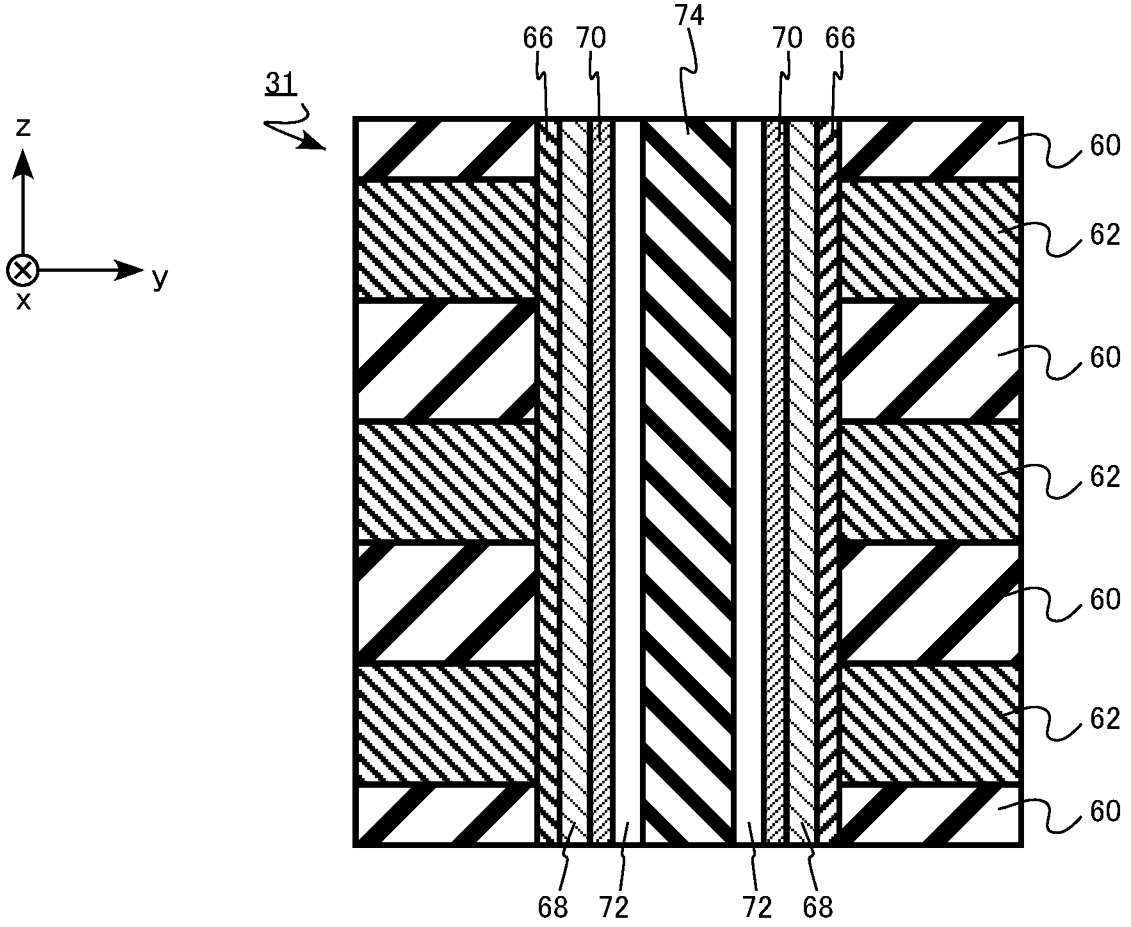
FIG. 10 is a schematic cross-sectional view illustrating an example of the method for manufacturing a semiconductor memory device according to the second embodiment.

Subsequently, the memory hole 64 is filled with a silicon oxide film 74 (FIG. 10). The silicon oxide film 74 is formed on the polycrystalline silicon film 72. The silicon oxide film 74 is formed by, for example, the CVD method. The silicon oxide film 74 finally becomes the core insulating region 20.

Figure 11:
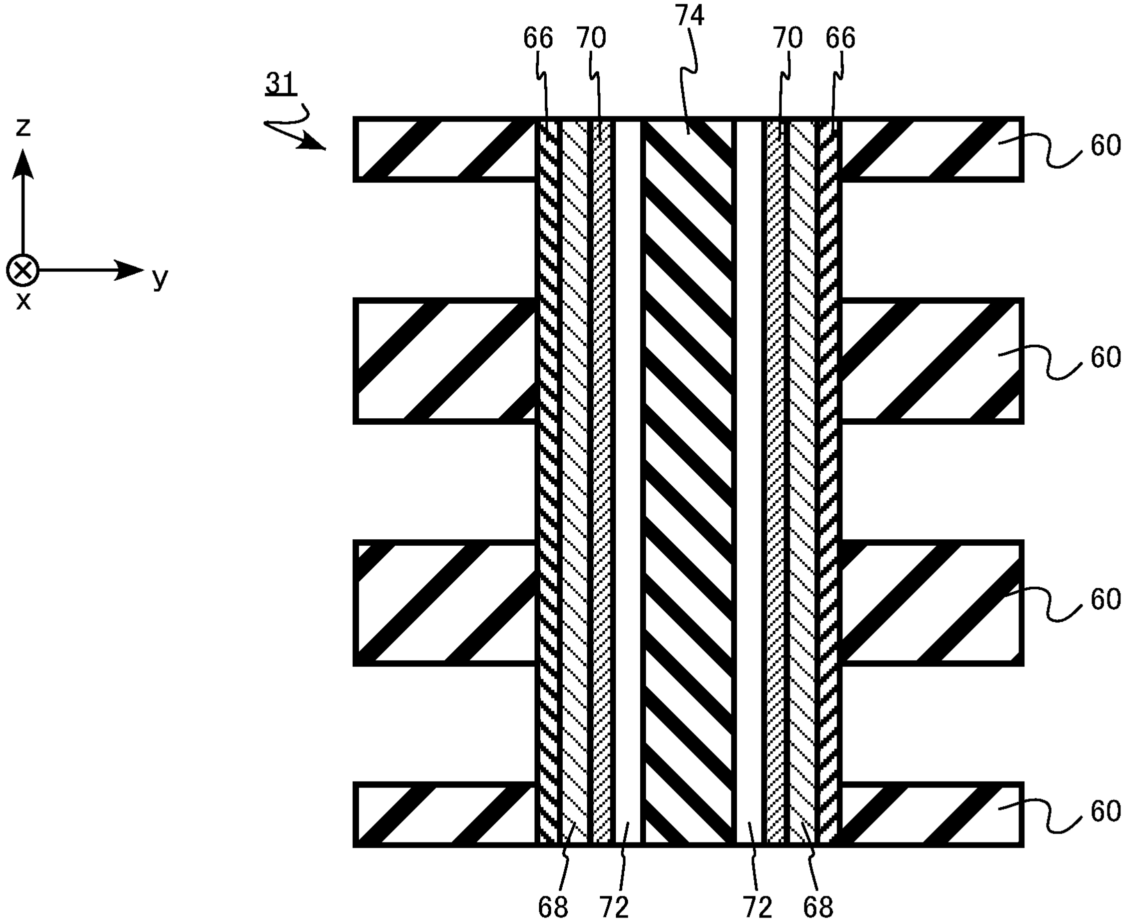
FIG. 11 is a schematic cross-sectional view illustrating an example of the method for manufacturing a semiconductor memory device according to the second embodiment.

Subsequently, the silicon nitride layer 62 is selectively removed by wet etching by using an etching groove (not illustrated) (FIG. 11). The silicon oxide film 66 is exposed by wet etching.

For the wet etching, for example, a phosphorous acid solution is used. The silicon nitride layer 62 is selectively etched with respect to the silicon oxide layer 60 and the silicon oxide film 66.

Figure 12:
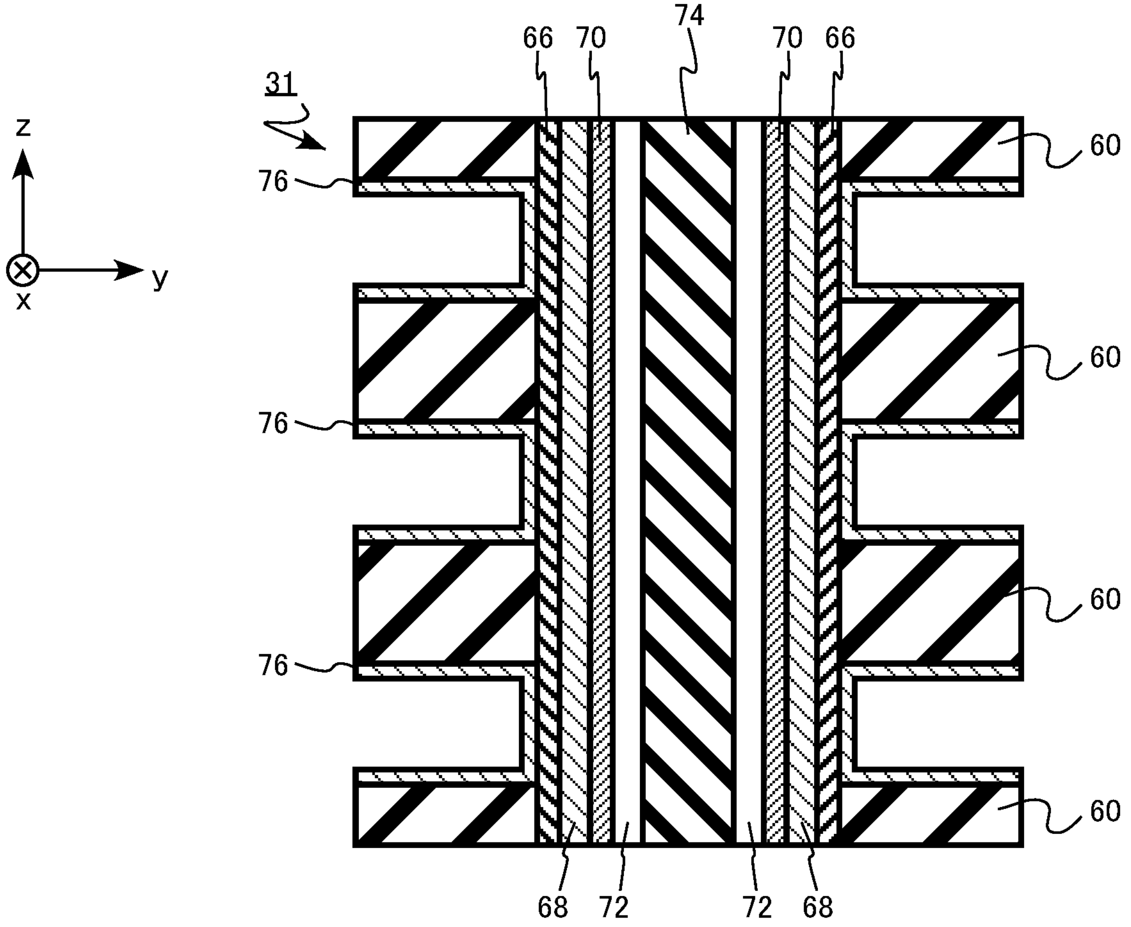
FIG. 12 is a schematic cross-sectional view illustrating an example of the method for manufacturing a semiconductor memory device according to the second embodiment.

Subsequently, an aluminum nitride film 76 is formed in the region from which the silicon nitride layer 62 is removed (FIG. 12). The aluminum nitride film 76 is an example of a first film. A thickness of the aluminum nitride film 76 is, for example, equal to or more than 0.5 nm and equal to or less than 5 nm. The aluminum nitride film 76 is formed by, for example, the ALD method.

Figure 13:
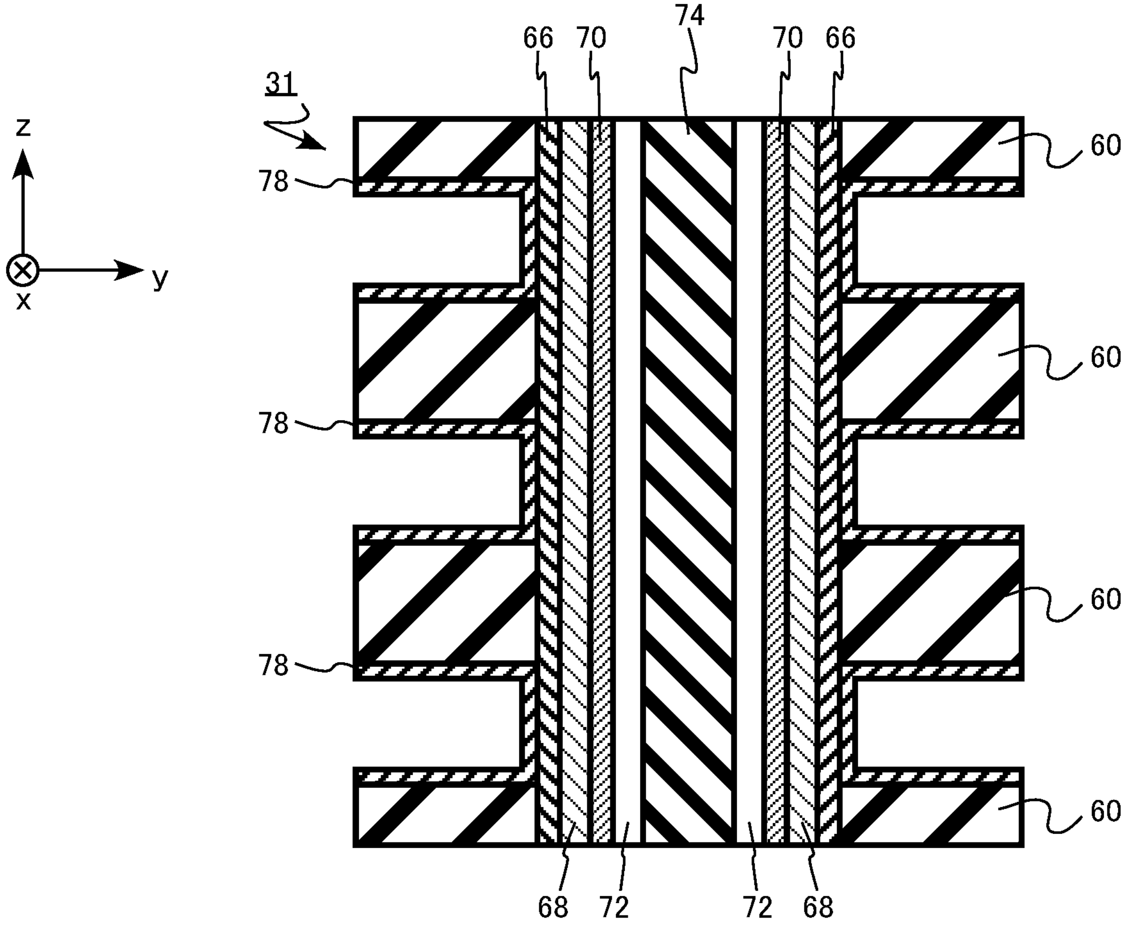
FIG. 13 is a schematic cross-sectional view illustrating an example of the method for manufacturing a semiconductor memory device according to the second embodiment.

Subsequently, an aluminum oxide film 78 is formed by oxidizing the aluminum nitride film 76 in an atmosphere containing heavy water ($D_2O$) (FIG. 13). The aluminum oxide film 78 is an example of a second film.

The aluminum nitride film 76 is oxidized by, for example, ISSG oxidation.

The aluminum oxide film 78 finally becomes the first block insulating layer 18.

Figure 14:
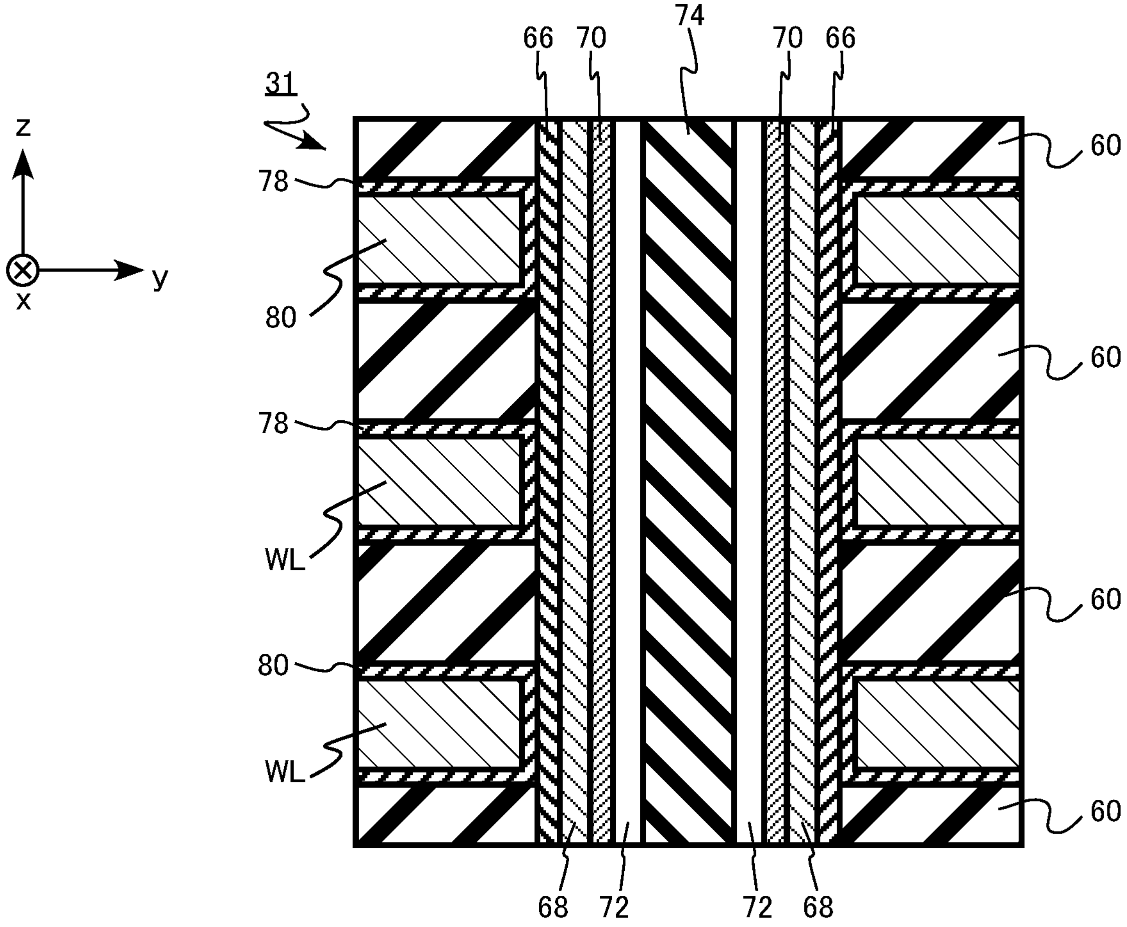
FIG. 14 is a schematic cross-sectional view illustrating an example of the method for manufacturing a semiconductor memory device according to the second embodiment.

Subsequently, a tungsten film 80 is formed on the aluminum oxide film 78 (FIG. 14). The tungsten film 80 is an example of a conductive film. The tungsten film 80 is formed by, for example, the CVD method.

The tungsten film 80 finally becomes the word line WL. Before the tungsten film 80 is formed, for example, a barrier metal film such as a titanium nitride film may be formed.

The memory cell array 200 of the semiconductor memory device according to the second embodiment illustrated in FIGS. 4A, 4B, and 5 is manufactured by the above manufacturing method.

Next, functions and effects of the semiconductor memory device according to the second embodiment will be described.

The three-dimensional NAND flash memory in which the memory cells are three-dimensionally arranged realizes a high degree of integration and low cost. In the three-dimensional NAND flash memory, for example, a memory hole penetrating a stacked body is formed in the stacked body in which a plurality of insulating layers and a plurality of gate electrode layers are alternately stacked. A memory string in which a plurality of memory cells are connected in series is formed by forming a charge storage layer and a semiconductor layer in the memory hole. The memory cell has a block insulating layer for suppressing escaping of charges retained in the charge storage layer to a gate electrode. In order to miniaturize the memory cell, a block insulating layer having a small thickness and a small leakage current is required.

The memory cell array 200 of the three-dimensional NAND flash memory according to the second embodiment includes the first block insulating layer 18. The first block insulating layer 18 has a small thickness of 5 nm or less.

The first block insulating layer 18 is thin, and thus, the miniaturization of the memory cell is promoted. The first block insulating layer 18 is thin, and thus, for example, the sizes of the memory cell in the z direction, the x direction, and the y direction can be reduced. Accordingly, for example, it is easy to increase the number of memory cells of the three-dimensional NAND flash memory, and it is easy to increase the capacity of the three-dimensional NAND flash memory.

The aluminum oxide contained in the first block insulating layer 18 contains at least one crystal phase selected from the group consisting of an α-aluminum oxide and a θ-aluminum oxide. The aluminum oxide contained in the first block insulating layer 18 contains an α-aluminum oxide, a θ-aluminum oxide, or both an α-aluminum oxide and a θ-aluminum oxide, and thus, the leakage current of the first block insulating layer 18 is reduced. It is considered that the α-aluminum oxide and the θ-aluminum oxide can reduce the leakage current as compared with another crystal phase, for example, a γ-aluminum oxide.

The first block insulating layer 18 contains a compound of deuterium (D) and oxygen (O). The compound of deuterium (D) and oxygen (O) is, for example, heavy water ($D_2O$) or DHO. The compound of deuterium (D) and oxygen (O) contained in the first block insulating layer 18 is derived from, for example, heavy water ($D_2O$) used for forming the aluminum oxide film 78.

The compound of deuterium (D) and oxygen (O) contained in the first block insulating layer 18 terminates, for example, a dangling bond contained in the first block insulating layer 18. Accordingly, the leakage current of the first block insulating layer 18 is further reduced.

From the viewpoint of reducing the leakage current of the first block insulating layer 18, at least one crystal phase selected from the group consisting of an α-aluminum oxide and a θ-aluminum oxide among the crystal phases of the aluminum oxides contained in the first block insulating layer 18 is preferably a main crystal phase. The term "main crystal phase" means that the at least one of the crystal phases has an abundance higher than an abundance of another crystal phase.

The second region **18*b* of the first block insulating layer 18 preferably contains γ-aluminum oxide. A molar fraction of the γ-aluminum oxide contained in the second region 18*b* is preferably larger than a molar fraction of the γ-aluminum oxide contained in the first region 18*a***.

The γ-aluminum oxide is present on a surface of the first block insulating layer 18 close to the word line WL, and thus, roughness of the surface of the first block insulating layer 18 increases. The roughness of the surface of the first block insulating layer 18 increases, and thus, it is easy to form the film on the surface of the first block insulating layer 18. For example, the film to be the word line WL can be easily formed.

The aluminum oxide in the first block insulating layer 18 is preferably uniaxially oriented. The aluminum oxide in the first block insulating layer 18 is uniaxially oriented, and thus, the leakage current of the first block insulating layer 18 is reduced.

According to the second embodiment, the leakage current of the first block insulating layer 18 is reduced, and thus, the leakage current flowing between the charge storage layer 16 and the word line WL is reduced. Accordingly, it is possible to suppress the escaping of the charges stored in the charge storage layer 16 to the word line WL or the injection of the charges from the word line WL into the charge storage layer 16. Thus, for example, erroneous writing of data in erasing the charges stored in the charge storage layer 16 can be suppressed.

As described above, according to the three-dimensional NAND flash memory according to the second embodiment, it is possible to provide a semiconductor memory device including an oxide film having a small leakage current.

In the second embodiment, although it has been described that the interlayer insulating layer 13 is provided between the word lines WL, a space between the word lines WL may be, for example, a cavity.

In the second embodiment, although the structure in which the semiconductor layer 10 is surrounded by the word lines WL has been described, the semiconductor layer 10 may be sandwiched between the word lines WL divided into two. In the case of this structure, the number of memory cells in the stacked body 30 can be doubled.

In the second embodiment, although the structure in which one semiconductor layer 10 is provided in one memory hole has been described, a structure in which the plurality of semiconductor layers 10 divided into two or more are provided in one memory hole may also be adopted. In the case of this structure, the number of memory cells in the stacked body 30 can be doubled or more.

In the second embodiment, although it has been described that the charge storage layer is the insulating layer, the charge storage layer may be a conductive layer, for example, a plurality of floating conductive layers electrically separated from each other.

While certain embodiments have been described, these embodiments have been presented by way of example only, and are not intended to limit the scope of the inventions. Indeed, the method for manufacturing the oxide film, the method for manufacturing the semiconductor memory device, the semiconductor device, and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing an oxide film, comprising:
forming an aluminum nitride film; and
forming an aluminum oxide film by oxidizing the aluminum nitride film in an atmosphere containing heavy water ($D_2O$),
wherein the aluminum nitride film is oxidized at a temperature of 950° C. or more in the forming the aluminum oxide film.

2. The method for manufacturing an oxide film according to claim 1, wherein the aluminum nitride film is oxidized in the forming the aluminum oxide film by supplying a process gas containing a deuterium ($D_2$) gas and an oxygen ($O_2$) gas to the atmosphere.

3. The method for manufacturing an oxide film according to claim 2, wherein a molar fraction of the deuterium ($D_2$) gas in the process gas is equal to or more than 5% and equal to or less than 15%.

4. The method for manufacturing an oxide film according to claim 1, wherein the aluminum nitride film contains at least one element selected from the group consisting of hafnium (Hf), zirconium (Zr), and silicon (Si).

5. The method for manufacturing an oxide film according to claim 1, wherein the aluminum oxide film contains at least one crystal phase selected from the group consisting of an alpha ($\alpha$)-aluminum oxide and a theta ($\theta$)-aluminum oxide.

6. The method for manufacturing an oxide film according to claim 1, wherein the aluminum oxide film contains an alpha ($\alpha$)-aluminum oxide and a theta ($\theta$)-aluminum oxide.

7. The method for manufacturing an oxide film according to claim 1, wherein the aluminum oxide film includes a first region and a second region on the first region, the first region contains at least one of an alpha ($\alpha$)-aluminum oxide and a theta ($\theta$)-aluminum oxide, the second region contains gamma ($\gamma$)-aluminum oxide, and a molar fraction of gamma ($\gamma$)-aluminum oxide contained in the second region is larger than a molar fraction of gamma ($\gamma$)-aluminum oxide contained in the first region.

8. A method for manufacturing a semiconductor memory device, comprising:

forming a stacked structure in which an oxide layer and a nitride layer are alternately stacked in a first direction;

forming a hole extending in the first direction in the stacked structure;

forming a charge storage layer inside the hole;

forming a first insulating film inside the hole;

forming a semiconductor layer inside the hole;

selectively removing the nitride layer with respect to the oxide layer;

forming an aluminum nitride film in a region where the nitride layer is removed;

forming an aluminum oxide film by oxidizing the aluminum nitride film in an atmosphere containing heavy water ($D_2O$); and forming a conductive film in the region, wherein the aluminum nitride film is oxidized at a temperature of 950° C. or more in the forming the aluminum oxide film.

9. The method for manufacturing a semiconductor memory device according to claim 8, further comprising:

forming a second insulating film inside the hole before the forming the charge storage layer.

10. The method for manufacturing a semiconductor memory device according to claim 9, wherein the second insulating film is exposed in the removing the nitride layer.

11. The method for manufacturing a semiconductor memory device according to claim 8, wherein a thickness of the aluminum nitride film is equal to or less than 5 nm.

12. The method for manufacturing a semiconductor memory device according to claim 8, wherein the aluminum nitride film is oxidized in the forming the aluminum oxide film by supplying a process gas containing a deuterium ($D_2$) gas and an oxygen ($O_2$) gas to the atmosphere.

13. The method for manufacturing a semiconductor memory device according to claim 12, wherein a molar fraction of the deuterium ($D_2$) gas in the process gas is equal to or more than 5% and equal to or less than 15%.

14. The method for manufacturing a semiconductor memory device according to claim 8, wherein the aluminum nitride film contains at least one element selected from the group consisting of hafnium (Hf), zirconium (Zr), and silicon (Si).

15. The method for manufacturing a semiconductor memory device according to claim 8, wherein the aluminum oxide film contains at least one crystal phase selected from the group consisting of an alpha ($\alpha$)-aluminum oxide and a theta ($\theta$)-aluminum oxide.

16. The method for manufacturing a semiconductor memory device according to claim 8, wherein the aluminum oxide film contains an alpha ($\alpha$)-aluminum oxide and a theta ($\theta$)-aluminum oxide.

17. The method for manufacturing a semiconductor memory device according to claim 8, wherein the aluminum oxide film includes a first region and a second region on the first region, the first region contains at least one of an alpha ($\alpha$)-aluminum oxide and a theta ($\theta$)-aluminum oxide, the second region contains gamma ($\gamma$)-aluminum oxide, and a molar fraction of gamma ($\gamma$)-aluminum oxide contained in the second region is larger than a molar fraction of gamma ($\gamma$)-aluminum oxide contained in the first region.

* * * * *